(12) United States Patent
Chan et al.

(10) Patent No.: US 9,166,591 B1
(45) Date of Patent: Oct. 20, 2015

(54) HIGH SPEED IO BUFFER

(71) Applicant: Altera Corporation, San Jose, CA (US)

(72) Inventors: Foong Tek Chan, Kuala Lumpur (MY); Xiabao Wang, Cupertino, CA (US); Khai Nguyen, San Jose, CA (US); Chiakang Sung, Milpitas, CA (US); Ket Chiew Sia, Bayan Lepas (MY); Boon Jin Ang, Butterworth (MY)

(73) Assignee: Altera Corporation, San Jose, CA (US)

( * ) Notice: Subject to any disclaimer, the term of this patent is extended or adjusted under 35 U.S.C. 154(b) by 48 days.

(21) Appl. No.: 13/957,310

(22) Filed: Aug. 1, 2013

Related U.S. Application Data

(62) Division of application No. 13/365,997, filed on Feb. 3, 2012, now abandoned.

(51) Int. Cl.
*H03K 19/094* (2006.01)
*H03K 19/0185* (2006.01)

(52) U.S. Cl.
CPC ............................... *H03K 19/018521* (2013.01)

(58) Field of Classification Search
CPC ............................................. H03K 19/018521
USPC ........................................................ 326/82, 83
See application file for complete search history.

(56) References Cited

U.S. PATENT DOCUMENTS

| | | | |
|---|---|---|---|
| 4,829,203 A * | 5/1989 | Ashmore, Jr. | 365/185.1 |
| 5,378,943 A | 1/1995 | Dennard | |
| 5,777,504 A * | 7/1998 | Chu et al. | 327/379 |
| 6,487,687 B1 * | 11/2002 | Blake et al. | 714/724 |
| 6,628,149 B2 | 9/2003 | Ajit | |
| 6,803,789 B1 | 10/2004 | Yu et al. | |
| 6,998,880 B2 | 2/2006 | Muller et al. | |
| 7,521,965 B2 | 4/2009 | Oertle et al. | |
| 7,696,807 B2 * | 4/2010 | Takahashi | 327/379 |
| 7,741,873 B2 * | 6/2010 | Hollis et al. | 326/83 |
| 7,804,348 B1 | 9/2010 | Atesoglu | |
| 8,283,946 B2 * | 10/2012 | Lee | 326/81 |

* cited by examiner

*Primary Examiner* — Don Le
(74) *Attorney, Agent, or Firm* — Womble Carlyle Sandridge & Rice LLP

(57) ABSTRACT

A high speed IO buffer is disclosed. The high speed IO buffer includes a first P-type metal oxide semiconductor (PMOS) transistor coupled to an IO voltage source. The high speed IO buffer also includes a first N-type metal oxide semiconductor (NMOS) transistor coupled to a ground source, a second PMOS transistor coupled to the first PMOS transistor and a pad and a second NMOS transistor coupled to the first NMOS transistor and the pad. The first PMOS transistor, the first NMOS transistor, the second PMOS transistor and the second NMOS transistor are arranged in a cascoded arrangement.

17 Claims, 4 Drawing Sheets

HIGH SPEED IO BUFFER

PRIORITY

This application is a divisional application of U.S. patent application Ser. No. 13/365,997, filed Feb. 3, 2012, which is herein incorporated by reference in its entirety for all purposes.

BACKGROUND

An input output (TO) circuit enables transmission of signals in/out of an integrated circuit (IC). A programmable IO supports multiple standards, e.g., high voltage standards, low voltage standards, high speed standards, low speed standards and etc. The programmable IO is commonly available in Programmable Logic Device (PLD).

The programmable IO is typically built with 2.5V Complementary Metal Oxide Semiconductor (CMOS) transistors. The 2.5V CMOS transistor has an acceptable reliability profile to support high voltage standards, but at the same time, has a performance bottleneck when supporting low voltage standards. The electrical current propagating through the drain of a 2.5V transistor is significantly insufficient for the purpose of IO functions for the low voltage standards. There are techniques for overcoming low drain current in 2.5V transistors, by way of increasing planar width on the 2.5V transistors, but such techniques may increases the total capacitance within the transistor.

The programmable IO supports high speed memory interface standards, which require relatively fast transistors in terms of switching on and off within the programmable IO. However, one of the drawbacks of relatively fast transistors is having a low overdrive voltage limit. Hence, when utilizing fast transistors, the programmable IO may not support high voltage standards, e.g., standards that utilize voltages of 2.5V or 3.3V.

It is within this context that the embodiments described herein arise.

SUMMARY

Embodiments described herein provide for a high speed IO buffer. It should be appreciated that the present embodiments can be implemented by numerous ways, such as a process, an apparatus, a system, a device, or a method. Several embodiments of the present invention are described below.

In one embodiment, a high speed IO buffer is described. The high speed IO buffer includes a first P-type metal oxide semiconductor (PMOS) transistor coupled to an IO voltage source. The high speed IO buffer also includes a first N-type metal oxide semiconductor (NMOS) transistor coupled to a ground source, a second PMOS transistor coupled with the first PMOS transistor and a pad and a second NMOS transistor coupled with the first NMOS transistor and the pad. The first PMOS transistor, the first NMOS transistor, the second PMOS transistor and the second NMOS transistor are in a cascoded arrangement.

In another embodiment, a pre-driver circuitry is described. The pre-driver circuitry includes a first NMOS transistor coupled to a ground terminal. The gate of the first NMOS transistor is coupled to an input terminal. The pre-driver circuitry also has a second NMOS transistor coupled to the ground terminal, where the gate of the second NMOS transistor is coupled to an inverter. The pre-driver circuitry also includes a first PMOS transistor coupled to an IO voltage terminal, where the gate of the first PMOS transistor is coupled to an output terminal. The pre-driver circuitry also includes a second PMOS transistor coupled to the IO voltage terminal and the output terminal, where the gate of the second PMOS is coupled to the drain of the first PMOS transistor. The pre-driver circuitry also includes a protective circuit coupled to the first PMOS transistor, the second PMOS transistor, the first NMOS transistor and the second NMOS transistor.

In another embodiment, an input buffer circuitry is described. The input buffer circuitry includes a first PMOS transistor coupled to a pre-driver voltage source and an input terminal. The input buffer circuitry also includes a first NMOS transistor coupled to the input terminal and a ground terminal. The input buffer circuitry includes a second NMOS transistor, where the source of the second NMOS transistor is coupled to the gates of the first NMOS transistor and first PMOS transistor, the drain of the second NMOS transistor is coupled to a pad terminal, and the gate of the second NMOS transistor is coupled to a pre-driver voltage source.

Other aspects of the embodiments will become apparent from the following detailed description, taken in conjunction with the accompanying drawings, illustrating by way of example of the principle of the embodiment.

BRIEF DESCRIPTION OF THE DRAWINGS

The embodiment may be understood by reference to the following description taken in conjunction with the accompanying drawings.

DETAILED DESCRIPTION

The following embodiments described a high speed IO buffer. It will be obvious, however, to one skilled in the art, that the present embodiment may be practiced without some or all of these specific details. In other instances, well-known operations have not been described in detail in order not to unnecessarily obscure the present embodiment.

The embodiment described below illustrates an Input Output (IO) buffer circuit that is capable of supporting wide ranges of voltage for various IO standards. The IO buffer circuit utilizes a low voltage transistor, e.g., a transistor that activates at 1.5V to support multiple single-ended IO standards. The IO buffer circuit is programmable to support standards ranging from voltage levels between about 1.2V to 3.3V in one embodiment. The IO buffer circuit achieves such flexibility through a cascoded arrangement technique illustrated below. The IO buffer circuit is also less costly to produce as there is no need for triple gate oxide processes in the fabrication of the circuit. The IO buffer circuit includes an output buffer, an input buffer and a pre-driver circuit.

Figure 1:
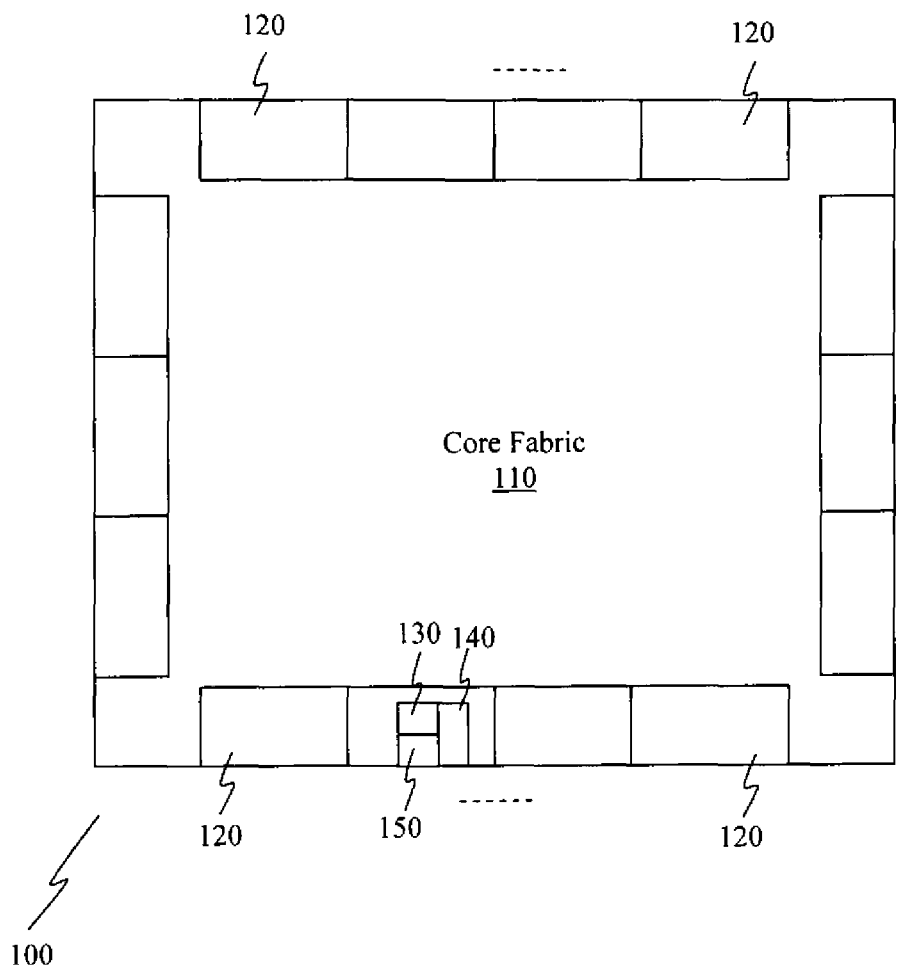
FIG. 1, meant to be illustrative and not limiting, illustrates an IC in accordance with one embodiment.

FIG. 1, meant to be illustrative and not limiting, illustrates an IC in accordance with one embodiment. IC 100 includes IOs 120 and core fabric 110. In one embodiment, IC 100 is an Application Specific Integrated Circuit (ASIC) or an Application Specific Standard Product (ASSP). In another embodiment, IC 100 is a PLD. IC 100 has core fabric 110 in the middle surrounded by IOs 120 at perimeter. It should be appreciated that IOs 120 and core fabric 110 may be placed anywhere in IC 100 subject to design factors.

Still referring to FIG. 1, core fabric 110 is designed to execute core functions of the IC 100, e.g., the core fabric of a memory device may store/provide data. Alternatively, the core fabric can be a fixed functionality circuit as in the ASIC/ASSP. In one embodiment, the core fabric has programmable logic elements that can be programmed for performing various functionalities, i.e., programmable logic elements within the PLD.

IOs 120 are utilized for receiving/transmitting signals in/out of IC 100. Each of IOs 120 is preferably coupled to an IO pin, where the IO pin connects to an external source. Hence, IOs 120 provide interfacing circuitry between the external source and core fabric 110. It should be appreciated that IOs 120 may be designed to support signals provided by an external source and to handle the signals in core fabric 110. In one embodiment, IOs 120 are programmable IOs. The programmable IOs support multiple standards, e.g., High Speed Transceiver Logic (HSTL), Stub Series Terminated Logic (SSTL), Low Voltage Complementary Oxide Semiconductor (LVCMOS), Transistor Transistor Logic (TTL), etc.

Still referring to FIG. 1, each of IOs 120 includes pre-driver 130, output buffer 150 and input buffer 140. The pre-driver 130 provides an output voltage (Vout) to output buffer 150. Pre-driver 130 provides 2.5V if output buffer 150 is outputting 2.5V in one embodiment. In another embodiment, pre-driver 150 is a level shifter, which shifts from one voltage level to another voltage level. Output buffer 150 transmits an IO signal from IC 100. Output buffer 150 is coupled to an IO pin of the IC 100. In one embodiment, output buffer 150 is placed between pre-driver 130 and the IO pin. Output buffer 150 transmits logic signals having a value of '1' or '0', depending on information to be transmitted. Input buffer 140 receives an IO signal from the external source into IC 100. The IO signal is routed to core fabric 110 for further processing.

Figure 2:
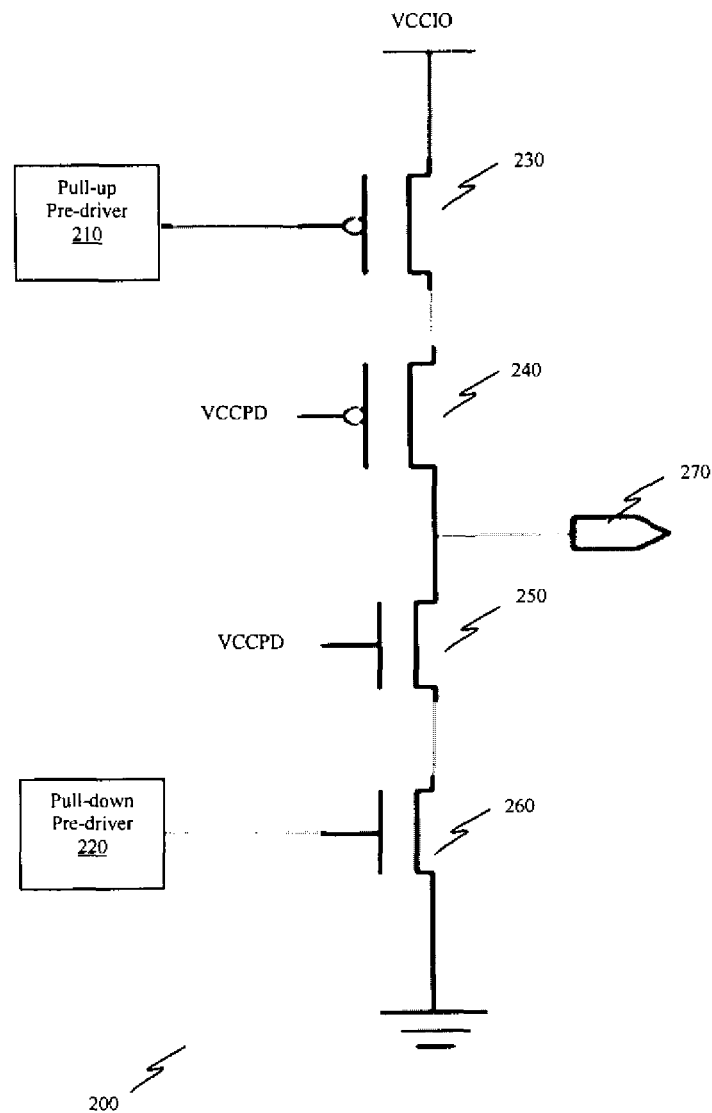
FIG. 2, meant to be illustrative and not limiting, illustrates an input output buffer in accordance with one embodiment.

FIG. 2, meant to be illustrative and not limiting, illustrates an output buffer in accordance with one embodiment. Output buffer 200 provides an interface for an IO signal to be either transmitted to an external source. Output buffer 200 includes P-channel Metal Oxide Semiconductor (PMOS) transistors 230 and 240, N-channel Metal Oxide Semiconductor (NMOS) transistors 250 and 260. Output buffer 200 also includes pad 270, pull-up pre-driver 210 and pull-down pre-driver 220.

Still referring to FIG. 2, output buffer 200 is coupled to an IO voltage source. The IO voltage source provides an IO voltage (VCCIO) to output buffer 200. In one embodiment, the VCCIO ranges between about 1.2V to 3.6V. The VCCIO level depends on IO standards, e.g., 3.3V LVCMOS standard has a VCCIO voltage level of 3.3V, 2.5V LVCMOS standard has a VCCIO voltage level of 2.5V and etc. It should be appreciated that the VCCIO is applied to IC via a VCCIO pin (not illustrated). Output buffer 200 is coupled to pad 270. Output buffer 200 transfers the IO signal to the external source through pad 270.

Transistors in output buffer 200 are in a cascoded arrangement. The cascoded arrangement is where one of the source or drain of a transistor is coupled to one of the drain or the source, respectively, of another transistor. In one embodiment, the cascoded arrangement includes PMOS transistor 230 electrically coupled to the IO voltage source, PMOS transistor 240 electrically coupled to PMOS transistor 230, PMOS transistor 240 electrically coupled to NMOS transistor 250, NMOS transistor 250 electrically coupled to NMOS transistor 260 and NMOS transistor 260 electrically coupled to a ground connection. It is appreciated that PMOS transistor 240 electrically decouples PMOS transistor 230 from pad 270 and NMOS transistor 250 electrically decouples NMOS transistor 260 from pad 270 in this configuration.

PMOS transistor 230 is electrically coupled to the IO voltage source and PMOS transistor 240. In one embodiment, the drain, source and gate of PMOS transistor 230 are electrically coupled to the IO voltage source, PMOS transistor 240 and pull-up pre-driver 210, respectively. NMOS transistor 260 is electrically coupled to the ground and NMOS transistor 250. In one embodiment, the drain, source and gate of NMOS transistor 260 are coupled to the ground, NMOS transistor 250 and pull-down pre-driver 220, respectively. PMOS transistor 230 and NMOS transistor 250 are low overdrive voltage transistors in one embodiment. The low overdrive voltage transistors are 1.5V transistors, which have a maximum junction voltage, e.g., voltage across source-to-gate, source-to-drain and gate-to-drain, of about 1.9V.

Still referring to FIG. 2, PMOS transistor 240 is placed between PMOS transistor 230 and pad 270. In one embodiment, the gate, drain and source of PMOS transistor 240 are electrically coupled a pre-driver voltage source, PMOS transistor 230 and pad 270, respectively. NMOS transistor 250 is placed between NMOS transistor 260 and pad 270. In one embodiment, the gate, drain and source of NMOS transistor 250 are electrically coupled a pre-driver voltage source, NMOS transistor 260 and pad 270, respectively. PMOS transistor 240 and NMOS transistor 250 electrically decouple a pathway that couples PMOS transistor 230 and pad 270 and also NMOS transistor 260 and pad 270, respectively. In one embodiment, PMOS transistor 240 and NMOS transistor 250 electrically decouple excessive junction voltage on PMOS transistor 230 and NMOS transistor 260. In one embodiment, PMOS transistor 240 and NMOS transistor 250 are low overdrive voltage transistors.

It should be appreciated that the pre-driver voltage source refers to a pre-driver circuit. The pre-driver voltage source produces a pre-driver voltage (VCCPD). The VCCPD is supplied to PMOS transistor 240 and NMOS transistor 250. In one embodiment, the VCCPD voltage ranges from about 1.7V to 1.9V. In another embodiment, the VCCPD is fixed at 1.8V, when the transistors in output buffer 200 are the 1.5V transistors. In an alternative embodiment, the range of the VCCPD voltage is selected to avoid excessive voltage stress at the gate-to-drain junctions.

Still referring to FIG. 2, pull-up pre-driver 210 and pull-down pre-driver 220 provide a bias voltage to PMOS transistor 230 and NMOS transistor 260, respectively. In one embodiment, the bias voltage from the pull-up pre-driver 210 is not lower than 1.4V when PMOS transistor 230 is a 1.5V transistor. In another embodiment, the bias voltage from pull-up pre-driver 210 swings from about 1.8V to 3.3V, where 1.8v activates PMOS transistor 230 and 3.3v deactivates PMOS transistor 230. In an alternative embodiment, the bias voltage from pull-up pre-driver 210 swings from the VCCPD voltage level to the VCCIO voltage level. Further details of pull-up pre-driver 210 embodiments are provided in FIG. 3. It should be appreciated that pull-down pre-driver 230 bias voltage ranges from a ground level, i.e., 0V, to the VCCPD level, i.e., about 1.8V. It should be further appreciated that output buffer 200 is capable of supporting high voltage standards, e.g., standards with 2.5v to 3.3V IO signals. Output buffer 200 is also capable of supporting high speed application standards, i.e., high speed memory standards. Output buffer 200 is also robust to reliability issues, i.e., gate-oxide breakdown and hot carrier injection reliability concerns.

Still referring to FIG. 2, when output buffer 200 drives a voltage level of about 3.3V through pad 270, pull-up pre-driver 210 supplies a voltage level of 1.8V to the gate of PMOS transistor 230 and the pull-down pre-driver supplies a voltage level of 0V to the gate of NMOS transistor 260. It is appreciated that the voltage level of 3.3V is the highest voltage level attainable among the available IO standards. VCCPD voltage level is at 1.8V and VCCIO voltage level is at 3.3V, in one embodiment. As such, the source and drain of PMOS transistor 230 are at 3.3V. The source and drain of PMOS transistor 240 are at voltage level of 3.3V. Therefore, pad 270 is at 3.3V voltage level. But, the source of NMOS transistor 250 is at 3.3V. Whereas, the drain of NMOS transistor 250 is at 1.2V, which is 1.8V minus threshold voltage (Vth) provided if the Vth is 0.6V. And, the source of NMOS transistor 260 is at 1.2V, which is 1.8V minus Vt. Whereas, the drain of NMOS transistor 260 is at 0V.

Still referring to FIG. 2, when output buffer 200 drives a voltage level of 0V through pad 270, pull-up pre-driver 210 supplies a voltage level of 3.3V to the gate of PMOS transistor 230 and pull-down pre-driver 220 supplies a voltage level of 1.8V to the gate of NMOS transistor 260. The VCCPD voltage level is at 1.8V and the VCCIO voltage level is at 3.3V. It is appreciated that the voltage level of 0V is the lowest voltage attainable among the available IO standards. The source and drain of PMOS transistor 230 are at 3.3V and 2.4V (1.8V+Vth), respectively. The source and drain of PMOS transistor 240 will be at 2.4V (1.8V+Vth) and 0V, respectively. Hence pad 270 will be at 0V. The source and drain of NMOS transistor 250 are at 0V. The source and drain of NMOS transistor 260 are at 0V. It should be appreciated that the maximum voltage junctions across PMOS transistors 230 and 240 and NMOS transistors 250 and 260 is below 1.9V when outputting the highest or the lowest attainable voltage out of output buffer 200.

Figure 3:
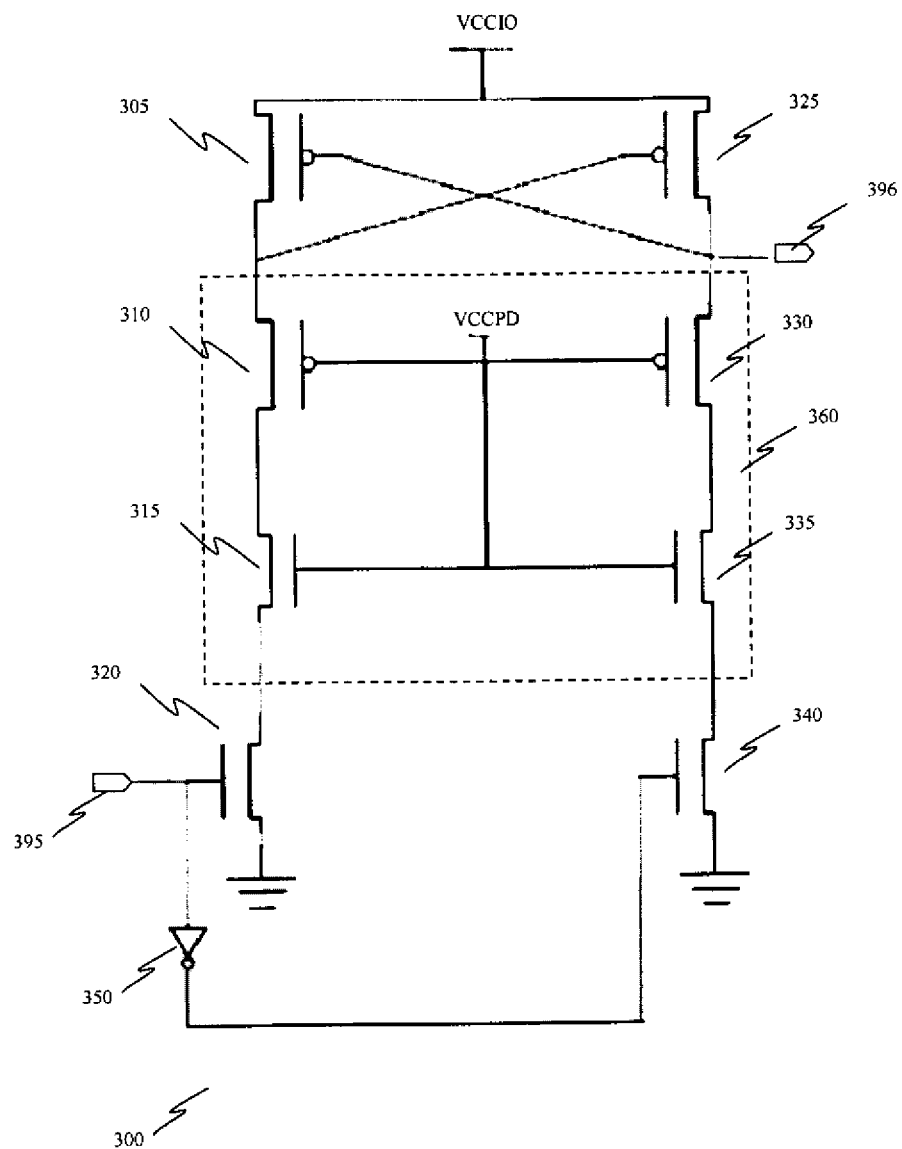
FIG. 3, meant to be illustrative and not limiting, illustrates a pull-up pre-driver circuit in accordance with one embodiment.

FIG. 3, meant to be illustrative and not limiting, illustrates a pull-up pre-driver circuit in accordance with one embodiment. Pull-up pre-driver circuit 300 is a voltage level shifter circuit in one embodiment. Pull-up pre-driver circuit 300 shifts voltage from one level to another level, e.g., from the VCCPD level to the VCCIO level. Pull-up pre-driver circuit 300 is at the voltage level of VCCPD, when input terminal 395 is at the ground voltage level. Pull-up pre-driver circuit 300 is at the VCCIO level, when input terminal 395 is at the power supply voltage (VCC) level.

In one embodiment, pull-up pre-driver circuit 300 is an implementation of pull-up pre-driver 210 of FIG. 2. Pull-up pre-driver circuit 300 includes NMOS transistor 320, NMOS transistor 340, PMOS transistor 305, PMOS transistor 325, inverter 350 and protective circuit 360.

Each of the transistors has at least three terminals, i.e., the source, the drain and the gate terminals. The source, drain and gate of NMOS transistor 320 are electrically coupled to a ground terminal, the protective circuit 360 and input terminal 395, respectively. The source, drain and gate of NMOS transistor 340 are electrically coupled to a ground terminal, protective circuit 360 and inverter 350, respectively. Inverter 350 inverts the input received from input terminal 395 before providing the input to the gate of NMOS transistor 340. The source, drain and gate of PMOS transistor 305 are electrically coupled to the IO voltage source, protective circuit 360 and the output terminal 396, respectively. The source, the drain and the gate of PMOS transistor 325 are electrically coupled to the IO voltage source, protective circuit 360 and the drain of PMOS transistor 305, respectively.

It should be appreciated that the protective circuit 360 is electrically coupled between PMOS transistors 305 and 325 and NMOS transistors 320 and 340. In one embodiment, protective circuit 360 electrically decouples PMOS transistor 305 and 325 from NMOS transistors 320 and 340. In another embodiment, protective circuit 360 protects against high junction voltage between PMOS transistors 305 and 325 and NMOS transistors 320 and 340.

Still referring to FIG. 3, the protective circuit 360 includes PMOS transistors 310 and 330 and NMOS transistors 315 and 335. The drain terminals of the PMOS transistor 310 and PMOS transistor 330 are electrically coupled to the source terminals of PMOS transistor 305 and PMOS transistor 325, respectively. The source terminals of NMOS transistor 315 and NMOS transistor 335 are electrically coupled to the drain terminals of NMOS transistor 320 and NMOS transistor 340, respectively. The source terminals of PMOS transistors 310 and 330 are electrically coupled to the drain terminals of NMOS transistors 315 and 335, respectively. The gate terminals of PMOS 310 and 330 and NMOS transistors 315 and 335 are electrically coupled to the pre-driver voltage source.

Still referring to FIG. 3, protective circuit 360 and elements coupled to protective circuit 360 are in a cascoded arrangement. In one embodiment, NMOS transistors 315 and NMOS transistor 320 are arranged in the cascoded arrangement. NMOS transistor 335 and NMOS transistor 340 are arranged the cascoded arrangement. NMOS transistors 315 and 335 protect NMOS transistors 320 and 340 from experiencing high junction voltages. It shall be appreciated that, the elements making up protective circuit 360 are also in a cascoded arrangement. PMOS transistors 310 and PMOS transistor 305 are in the cascoded arrangement. Furthermore, PMOS transistor 330 and PMOS transistor 325 are in the cascoded arrangement. PMOS transistors 310 and 330 protect PMOS transistors 305 and 325 from experiencing high voltages at the terminals and limits minimum voltage at output terminal 396 to VCCPD level. In one embodiment, the minimum voltage at output terminal 396 is limited to 1.4V. It should be appreciated that transistors 305, 310, 315, 320, 325, 330, 335 and 340 are low overdrive voltage transistors in one embodiment.

Still referring to FIG. 3, when the pre-driver circuitry 300 is to transfer VCCPD+Vth voltage through output terminal 396, NMOS transistors 340 and 335 and PMOS transistor 330 are activated. The gates of the remaining transistors are shutdown hence decoupling themselves from pre-driver circuitry 300. As for the activated transistors, when input terminal 395 is supplied with 0V, inverter 350 inverts the 0V to the core voltage that is the Vcc voltage level of 1V. The source, drain and gate of NMOS transistor 340 are at 0V, 0V and 1V, respectively. The source, drain and gate of NMOS transistor 335 are at 0V, 0V and 1.8V, respectively. The source, drain and gate of PMOS transistor 330 are at 0V, 2.4V (VCCPD+Vth), and 1.8V, respectively.

Still referring to FIG. 3, when pre-driver 300 transfers VCCIO voltage out from output terminal 396, NMOS transistor 320, NMOS transistor 315, PMOS transistor 310 and PMOS transistor 325 are activated. The gates of the remaining transistors are shutdown hence decoupling themselves from the pre-driver circuitry 300. As for the activated transistors, when input terminal 395 is supplied with the VCC voltage of 1V, the source, drain and gate of NMOS transistor 320 are at 0V, 0V and 1V, respectively. The source, drain and gate of NMOS transistor 315 are 0V, 0V and 1.8V, respectively. The source, drain and gate of PMOS transistor 310 are 0V, 2.4V (VCCP+Vth) and 1.8V, respectively. The source, drain and gate of PMOS transistor 325 are 3.3V, 3.3V, and 2.4V (VCCPD+Vth), respectively.

Figure 4A:
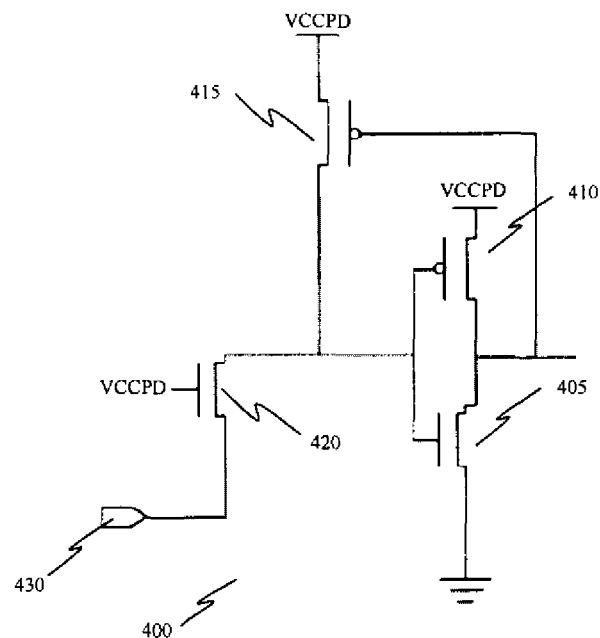
FIG. 4A and FIG. 4B, meant to be illustrative and not limiting, illustrates implementations of input buffers in accordance with one embodiment.
Figure 4B:
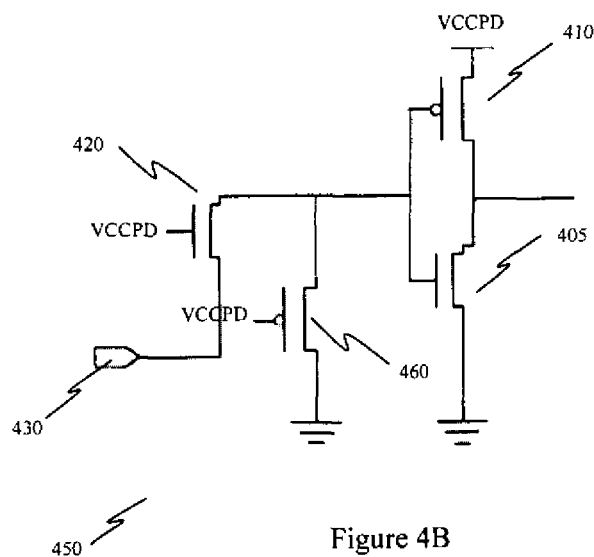

FIG. 4A and FIG. 4B, meant to be illustrative and not limiting, illustrates implementation of input buffers in accordance with one embodiment. The input buffers 400 and 450 provide an interface to accept an IO signal from an external source. It is appreciated that one of input buffers 400 or 450 can be selected for implementing in an IC. Input buffers 400 and 450 are built utilizing multiple PMOS and NMOS transistors. Input buffers 400 and 450 include PMOS transistor 410 and NMOS transistors 405 and 420, and a pad 430. Input buffers 400 also includes PMOS transistor 415. Whereas, input buffer 450 also includes PMOS transistor 460.

Still referring to FIGS. 4A and 4B, input buffers 400 and 450 receive the IO signal from pad 430. It is appreciated that voltage of the IO signal depends on the respective IO standards. Pad 430 is coupled to an IO pin (not illustrated) in one embodiment. Input buffers 400 and 450 receive the IO signal from the IO pin via pad 430. Input buffers 400 and 450 are electrically coupled to the pre-driver voltage source.

PMOS transistor 410 for each of input buffers 400 and 450 is electrically coupled to the pre-driver voltage source and an input terminal. In one embodiment, the source and drain of PMOS transistor 410 are electrically coupled to the pre-driver voltage source and the input terminal, respectively. The pre-driver voltage source provides the VCCPD voltage to PMOS transistor 410. NMOS transistor 405 is electrically coupled to the input terminal and a ground terminal. In one embodiment, the source and drain of NMOS transistor 405 are electrically coupled to the input terminal and the ground terminal, respectively. It is appreciated that the ground terminal is at zero voltage level. The input terminal couples input buffers 400 or 450 to the remaining circuits, e.g., core fabric 110 of FIG. 1. The input terminal is placed between an interconnection coupling the drain of PMOS transistor 410 and the source of NMOS transistor 405, in one embodiment.

The gates of PMOS transistor 410 and NMOS transistor 405 are electrically coupled to each other and also NMOS transistor 420. It should be appreciated that PMOS transistor 410 and NMOS transistor 405 are equivalent to an inverter circuit in one embodiment. In one embodiment, the source of NMOS transistor 420 is coupled to the gates of PMOS transistor 410 and NMOS transistor 405. Whereas the drain and gate of NMOS transistor 420 are electrically coupled to pad 430 and pre-driver voltage source, respectively.

It is appreciated that direct coupling to high voltage, e.g., voltage level of 3.3V, to the gates of PMOS transistors 410 and NMOS transistors 405 may result in gate breakdown of PMOS transistor 410 and NMOS transistor 405. Therefore, NMOS transistor 420 limits the maximum voltages at the gates of PMOS transistor 410 and NMOS transistor 405 to the VCCPD level.

Referring to FIG. 4A, input buffer 400 includes PMOS transistor 415 that couples the pre-driver voltage source to the gates of PMOS transistor 410 and NMOS transistor 405. In one embodiment, the source, drain and gate of PMOS transistor 415 are electrically coupled to the pre-driver voltage source, the source of PMOS transistor 420 and the input terminal, respectively. It should be appreciated that PMOS transistor 415 mitigates the threshold voltage drop arising from current flowing through NMOS transistor 420. PMOS transistor 415 is equivalent to a half-latch structure in one embodiment.

Still referring to FIG. 4A, input buffer 400 receives IO signal of 3.3V at pad 430. The source, drain and gate for NMOS transistor are at 3.3V, 1.8V, and 1.8V, respectively. The 1.8V at the source of NMOS transistor 420 is due to a voltage provided by the source of NMOS transistor, which is 1.2V, and a compensation voltage provided by the drain of PMOS transistor 415, which is 0.6V. Hence, the gates of PMOS transistor 410 and NMOS transistor 405, are exposed to a maximum junction voltage of 1.8V.

Referring to FIG. 4B, input buffer 450 includes PMOS transistor 460 that couples the gates of PMOS transistor 410 and NMOS transistor 405 to the ground terminal. The source, drain and gate of PMOS transistors 460 are electrically coupled to the source of PMOS transistor 420, the ground terminal and the pre-driver voltage source, respectively. In one embodiment, NMOS transistor 420 is a "native device". The native device is a transistor that has the Vth of zero. PMOS transistor 460 prevents the gate of PMOS transistor 410 and NMOS transistor 405 from being overcharged to a voltage above VCCPD.

Still referring to FIG. 4B, input buffer 450 receives an IO signal having 3.3V on the pad 430. The source, drain and gate at the NMOS transistor are at 3.3V, 1.8V, and 1.8V, respectively. Hence, the gates of PMOS transistor 410 and NMOS transistor 405 will be exposed to a maximum junction voltage of 1.8V.

The embodiments, thus far, were described with respect to integrated circuits. The method and apparatus described herein may be incorporated into any suitable circuit. For example, the method and apparatus may be incorporated into numerous types of devices such as microprocessor, programmable logic devices, application specific standard products (ASSPs) or application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An input buffer, comprising:
   a first PMOS transistor coupled to a pre-driver voltage source and an input terminal;
   a first NMOS transistor coupled to the input terminal and a ground terminal;
   a second NMOS transistor, wherein the source of the second NMOS transistor is coupled to the gates of the first NMOS transistor and the first PMOS transistor, wherein the drain of the second NMOS transistor is coupled to a pad terminal, and wherein the gate of the second NMOS transistor is coupled to a pre-driver voltage source; and
   a second PMOS transistor, wherein a gate of the second PMOS transistor is coupled to the pre-driver voltage source, a drain of the second PMOS transistor is coupled to the ground terminal and a source of the second PMOS transistor is coupled to the source of the second NMOS transistor.

2. The input buffer in claim 1, wherein the second NMOS transistor limits the maximum voltage within the first PMOS and NMOS transistors to a predefined maximum voltage.

3. The input buffer in claim 2, wherein the predefined maximum voltage ranges from 1.7V-1.9V.

4. The input buffer in claim 1, further comprising:
   a second PMOS transistor, wherein a gate of the second PMOS is coupled to the input terminal, a source of the second PMOS is coupled to the pre-driver voltage source and a drain of the second PMOS transistor is coupled to the gates of the first PMOS and NMOS transistors.

5. The input buffer in claim 1, wherein the second NMOS transistor is a zero threshold voltage transistor.

6. An input/output circuit, comprising:
   a pre-driver;
   an output buffer; and
   an input buffer, comprising:
   a first PMOS transistor coupled to a pre-driver voltage source and an input terminal;
   a first NMOS transistor coupled to the input terminal and a ground terminal;
   a second NMOS transistor, wherein the source of the second NMOS transistor is coupled to the gates of the first NMOS transistor and the first PMOS transistor, wherein the drain of the second NMOS transistor is coupled to a pad terminal, and wherein the gate of the second NMOS transistor is coupled to a pre-driver voltage source; and
   a second PMOS transistor, wherein a gate of the second PMOS transistor is coupled to the pre-driver voltage source, a drain of the second PMOS transistor is coupled to the ground terminal and a source of the second PMOS transistor is coupled to the source of the second NMOS transistor.

7. The input/output circuit in claim 6, wherein the second NMOS transistor limits the maximum voltage within the first PMOS and NMOS transistors to a predefined maximum voltage.

8. The input/output circuit in claim 7, wherein the predefined maximum voltage ranges from 1.7V-1.9V.

9. The input/output circuit in claim 6, further comprising:
   a second PMOS transistor, wherein a gate of the second PMOS is coupled to the input terminal, a source of the second PMOS is coupled to the pre-driver voltage source and a drain of the second PMOS transistor is coupled to the gates of the first PMOS and NMOS transistors.

10. The input/output circuit in claim 6, further comprising:
    a second PMOS, wherein a gate of the second PMOS is coupled to the pre-driver voltage source, a drain of the second PMOS is coupled to the ground terminal and a source of the second PMOS is coupled to the source of the second NMOS transistor.

11. The input/output circuit in claim 6, wherein the second NMOS transistor is a zero threshold voltage transistor.

12. An integrated circuit, comprising:
    a core fabric; and
    a plurality of input/output circuits, comprising:
    a pre-driver;
    an output buffer; and
    an input buffer, comprising:
    a first PMOS transistor coupled to a pre-driver voltage source and an input terminal;
    a first NMOS transistor coupled to the input terminal and a ground terminal;
    a second NMOS transistor, wherein the source of the second NMOS transistor is coupled to the gates of the first NMOS transistor and the first PMOS transistor, wherein the drain of the second NMOS transistor is coupled to a pad terminal, and wherein the gate of the second NMOS transistor is coupled to a pre-driver voltage source; and
    a second PMOS transistor, wherein a gate of the second PMOS transistor is coupled to the pre-driver voltage source, a drain of the second PMOS transistor is coupled to the ground terminal and a source of the second PMOS transistor is coupled to the source of the second NMOS transistor.

13. The integrated circuit in claim 12, wherein the second NMOS transistor limits the maximum voltage within the first PMOS and NMOS transistors to a predefined maximum voltage.

14. The integrated circuit in claim 13, wherein the predefined maximum voltage ranges from 1.7V-1.9V.

15. The integrated circuit in claim 12, further comprising:
    a second PMOS transistor, wherein a gate of the second PMOS is coupled to the input terminal, a source of the second PMOS is coupled to the pre-driver voltage source and a drain of the second PMOS transistor is coupled to the gates of the first PMOS and NMOS transistors.

16. The integrated circuit in claim 12, further comprising:
    a second PMOS, wherein a gate of the second PMOS is coupled to the pre-driver voltage source, a drain of the second PMOS is coupled to the ground terminal and a source of the second PMOS is coupled to the source of the second NMOS transistor.

17. The integrated circuit in claim 12, wherein the second NMOS transistor is a zero threshold voltage transistor.

* * * * *